(12) United States Patent
Toba et al.

(10) Patent No.: US 12,426,164 B2
(45) Date of Patent: *Sep. 23, 2025

(54) SEMICONDUCTOR PACKAGE

(71) Applicant: RESONAC CORPORATION, Tokyo (JP)

(72) Inventors: Masaya Toba, Tokyo (JP); Kazuhiko Kurafuchi, Tokyo (JP); Takashi Masuko, Tokyo (JP); Kazuyuki Mitsukura, Tokyo (JP); Shinichiro Abe, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/650,160

(22) Filed: Apr. 30, 2024

(65) Prior Publication Data
US 2024/0306308 A1 Sep. 12, 2024

Related U.S. Application Data

(63) Continuation of application No. 17/415,041, filed as application No. PCT/JP2019/049935 on Dec. 19, 2019, now Pat. No. 12,004,305.

(30) Foreign Application Priority Data

Dec. 20, 2018 (JP) .................. 2018-238340

(51) Int. Cl.
*B32B 3/08* (2006.01)
*B32B 3/02* (2006.01)
(Continued)

(52) U.S. Cl.
CPC .............. *H05K 3/181* (2013.01); *B32B 3/02* (2013.01); *B32B 3/08* (2013.01); *C23C 18/1605* (2013.01);
(Continued)

(58) Field of Classification Search
CPC ........... B32B 3/08; B32B 3/085; B32B 3/263; B32B 3/266; B32B 2457/08
See application file for complete search history.

(56) References Cited

U.S. PATENT DOCUMENTS

| 4,482,596 A | 11/1984 | Gulla et al. |
| 11,979,990 B2 * | 5/2024 | Toba .................. C23C 18/48 |

(Continued)

FOREIGN PATENT DOCUMENTS

| CN | 101472407 A | 7/2009 |
| JP | S57-501786 A | 10/1982 |

(Continued)

OTHER PUBLICATIONS

Jinseong Kim et al., "Application of Through Mold via (TMV) as PoP Base Package", Electronic Components and Technology Conference (ECTC), 2008, p. 1089-p. 1092.

(Continued)

*Primary Examiner* — Elizabeth E Mulvaney
(74) *Attorney, Agent, or Firm* — FITCH, EVEN, TABIN & FLANNERY, LLP

(57) ABSTRACT

A semiconductor package includes a wiring board and a semiconductor element mounted on the wiring board. The wiring board includes a first insulating material layer having a surface with an arithmetic average roughness Ra of 100 nm or less, a metal wiring provided on the surface of the first insulating material layer, and a second insulating material layer provided to cover the metal wiring. The metal wiring is configured by a metal layer in contact with the surface of the first insulating material layer and a conductive part stacked on a surface of the metal layer, and a nickel content rate of the metal layer is 0.25 to 20% by mass.

8 Claims, 3 Drawing Sheets

(51) Int. Cl.
  *C23C 18/16* (2006.01)
  *C23C 18/20* (2006.01)
  *C23C 18/32* (2006.01)
  *C23C 18/38* (2006.01)
  *H05K 1/03* (2006.01)
  *H05K 3/18* (2006.01)

(52) U.S. Cl.
  CPC ............ *C23C 18/165* (2013.01); *C23C 18/20* (2013.01); *C23C 18/32* (2013.01); *C23C 18/38* (2013.01); *H05K 1/032* (2013.01); *H05K 2201/068* (2013.01)

(56) References Cited

U.S. PATENT DOCUMENTS 12,004,305 B2 * 6/2024 Toba ................ H05K 3/381

| | | |
|---|---|---|
| 2002/0035784 A1 | 3/2002 | Koyama et al. |
| 2011/0221071 A1 | 9/2011 | Motohashi et al. |

FOREIGN PATENT DOCUMENTS

| JP | S59-200489 A | 11/1984 |
|---|---|---|
| JP | 2002-057456 A | 2/2002 |
| JP | 2003-318519 A | 11/2003 |
| JP | 2005-005319 A | 1/2005 |
| JP | 2011-042818 A | 3/2011 |
| JP | 2012-136769 A | 7/2012 |

OTHER PUBLICATIONS

Seung Wook Yoon et al., "Advanced Low Profile POP Solution with Embedded Wafer Level POP (eWLB-PoP) Technology", Electronic Components and Technology Conference (ECTC), 2012, p. 1250-p. 1254.

* cited by examiner

SEMICONDUCTOR PACKAGE

CROSS-REFERENCE TO RELATED APPLICATIONS

This application is a continuation of prior application Ser. No. 17/415,041, filed Jun. 17, 2021, which is a 371 national stage application of international application no. PCT/JP2019/049935, filed Dec. 19, 2019, which claims priority benefit of Japanese application no. 2018-238340, filed Dec. 20, 2018, the contents of each of which are incorporated herein by reference.

TECHNICAL FIELD

The present disclosure relates to a wiring board and a method for manufacturing the same.

BACKGROUND ART

There has been proposed an embodiment in which semiconductor elements (hereinafter, referred to as "chips" depending on circumstances) different in performance are mixedly mounted on one package for the purpose of higher density and higher performance of a semiconductor package. From the viewpoint of cost, a technology for high density interconnect between the chips becomes important (see Patent Literature 1).

A connection method called a package-on-package technology has been widely applied to a smartphone and a tablet terminal. The package-on-package technology is a method for connecting different packages on a package by flip-chip mounting (see Non Patent Literatures 1 and 2). Further, there has been proposed, as a form of mounting chips at higher density, a packaging technology using an organic substrate having a high density wiring (organic interposer), a fan-out packaging technology (FO-WLP) having a through mold via (TMV), a packaging technology using a silicon interposer or a glass interposer, a packaging technology using a through-silicon via (TSV), a packaging technology using a chip embedded in a substrate for inter-chip transmission, or the like. Particularly, in the organic interposer and the FO-WLP, in a case where the chips are mounted in parallel with each other, a micro wiring layer is required in order to make the chips electrically conduct with each other at a high density (see Patent Literature 2).

CITATION LIST

Patent Literature

Patent Literature 1: Japanese Unexamined Patent Publication No. 2003-318519
Patent Literature 2: US Patent Application Publication No. 2011/0221071

Non Patent Literature

Non Patent Literature 1: Application of Through Mold Via (TMV) as PoP Base Package, Electronic Components and Technology Conference (ECTC), 2008
Non Patent Literature 2: Advanced Low Profile PoP Solution with Embedded Wafer Level PoP (eWLB-PoP) Technology, ECTC, 2012

SUMMARY OF INVENTION

Technical Problem

In the technology described in Patent Literature 1, after the treatment with a desmear treatment solution, a seed layer is formed by electroless plating. The seed layer is a metal layer to be formed in the manufacturing process of the wiring board and is also called a power supply layer. That is, a conductive part is formed on the surface of the seed layer by supplying power to the seed layer. A part of the seed layer constitutes the metal wiring together with the conductive part. In the technology described in Patent Literature 1, the surface of the insulating material layer is roughened by performing a wet desmear treatment. The surface of the insulating material layer is properly roughened, and thereby the adhesiveness between the seed layer and the insulating material layer is improved by an anchor effect.

Recently, a semiconductor element tends to be decreased in size, and a wiring board is also required to be micronized. When the surface of the insulating material layer is roughened in order to obtain the anchor effect as decreased above, it is difficult to form a micronized wiring pattern (particularly, L/S (line/space) is 10/10 µm or less) on the surface thereof. Recently, in the wiring board, a decrease in transmission loss in high-frequency bands is also required. As described above, when the surface of the insulating material layer is roughened, the transmission loss is increased by a skin effect. That is, in the method for manufacturing a wiring board, it is an object to decrease a transmission loss in a high frequency while securing the adhesiveness between the insulating material layer and the metal wiring.

The present disclosure has been devised in view of the above-described object, and provides a wiring board, which has excellent adhesiveness between an insulating material layer and a metal wiring and a small transmission loss in a high frequency, and a method for manufacturing the same.

Solution to Problem

A method for manufacturing a wiring board according to an aspect of the present disclosure includes, in the following order:
(a) a step of adsorbing an electroless plating catalyst to a first insulating material layer;
(b) a step of forming a metal layer on a surface of the first insulating material layer by electroless plating;
(c) a step of forming a resist having an opening for wiring pattern formation on a surface of the metal layer; and
(d) a step of forming a conductive part in a region, which is the surface of the metal layer and is exposed from the resist, by electrolytic plating, in which
an arithmetic average roughness Ra of the surface of the first insulating material layer is 100 nm or less, and a nickel content rate of the metal layer is 0.25 to 20% by mass.

According to the studies of the present inventors, when the nickel content rate of the metal layer (corresponding to the above-described seed layer) is 0.25% by mass or more, even though the surface of the first insulating material layer is sufficiently flat (for example, the arithmetic average roughness Ra is 100 nm or less), sufficient adhesiveness between the insulating material layer and the metal wiring can be secured. This is speculated that nickel contained in the metal layer that is in contact with the first insulating material layer contributes to improvement in adhesiveness. On the other hand, when the nickel content rate of the metal layer is 20% by mass or less and the surface of the first insulating material layer is sufficiently flat, a transmission loss in a high frequency can be sufficiently decreased. The metal layer containing a predetermined amount of nickel can be formed, for example, using an electroless copper-nickel-phosphorus plating solution.

As described above, in the present disclosure, since the surface of the first insulating material layer is preferably flat, it is preferable that a roughening treatment with a desmear treatment solution is not performed with respect to the surface of the first insulating material layer before performing the step (a). According to the studies of the present inventors, although the surface of the first insulating material layer is not roughened, it is preferable to form a modified region having voids communicating with the interior from the surface of the first insulating material layer on the surface layer of the first insulating material layer. Such a modified region may be formed by performing at least one modification treatment selected from the group consisting of ultraviolet ray irradiation, electron beam irradiation, an ozone water treatment, a corona discharge treatment, and a plasma treatment with respect to the surface of the first insulating material layer, before performing the step (a).

The above-described manufacturing method may further include, in the following order, (e) a step of removing the resist, (f) a step of removing the metal layer exposed by the removal of the resist and the catalyst between the metal layer and the first insulating material layer, and (g) a step of forming a second insulating material layer to cover a metal wiring configured by the metal layer remaining on the first insulating material layer and the conductive part, after the step (d).

A wiring board according to an aspect of the present disclosure includes a first insulating material layer having a surface with an arithmetic average roughness Ra of 100 nm or less, a metal wiring provided on the surface of the first insulating material layer, and a second insulating material layer provided to cover the metal wiring, in which the metal wiring is configured by a metal layer in contact with the surface of the first insulating material layer and a conductive part stacked on a surface of the metal layer, and a nickel content rate of the metal layer is 0.25 to 20% by mass.

When the nickel content rate of the metal layer is 0.25% by mass or more, even though the surface of the first insulating material layer is sufficiently flat (for example, the arithmetic average roughness Ra is 100 nm or less), the above-described wiring board has sufficient adhesiveness between the insulating material and the metal wiring. On the other hand, when the nickel content rate of the metal layer is 20% by mass or less and the surface of the first insulating material layer is sufficiently flat, a transmission loss in a high frequency can be sufficiently small. The nickel content rate of the metal layer may be, for example, 3 to 20% by mass and may be 0.25 to 3% by mass.

The first insulating material layer may be composed of a cured product of a thermosetting resin composition and may be composed of a cured product of a photosensitive resin composition.

Advantageous Effects of Invention

According to the present disclosure, there are provided a wiring board, which has excellent adhesiveness between an insulating material layer and a metal wiring and a small transmission loss in a high frequency, and a method for manufacturing the same.

DESCRIPTION OF EMBODIMENTS

Figure 1A:
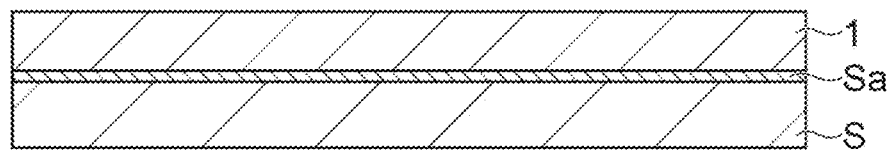
FIG. 1A to FIG. 1D are cross-sectional views schematically illustrating a manufacturing process of a wiring board according to an embodiment of the present disclosure.

Hereinafter, embodiments of the present disclosure will be specifically described with reference to the drawings. In the following description, the same or similar portions are denoted with the same reference signs and repeated description is omitted. Furthermore, unless otherwise specified, positional relationships such as top, bottom, right, and left are assumed to be based on positional relationships illustrated in the drawings. Further, dimension ratios in the drawings are not limited to illustrated ratios.

In a case where terms "left", "right", "front side", "rear side", "over", "under", "upward", "downward", and the like are used in the description of the present specification and the claims, these are intended to provide explanation, and do not necessarily mean a permanent relative positional relationship. Furthermore, the term "layer" encompasses a structure of a shape thereof formed all over a surface seen as a plan view and also a structure of a shape thereof partially formed.

Figure 1B:
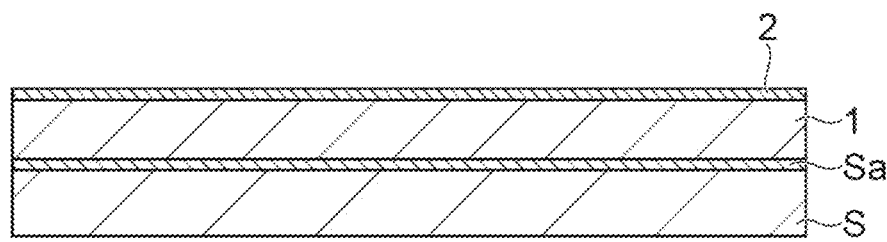
Figure 1C:
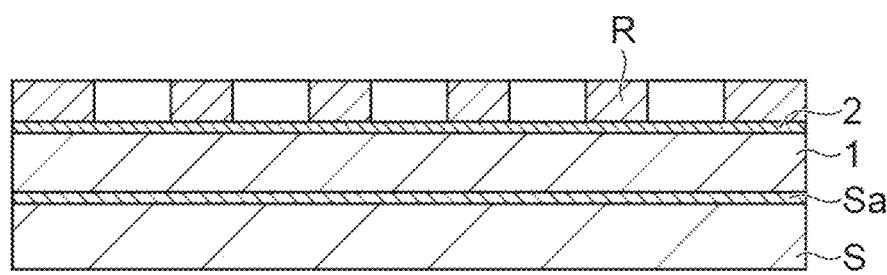
Figure 1D:
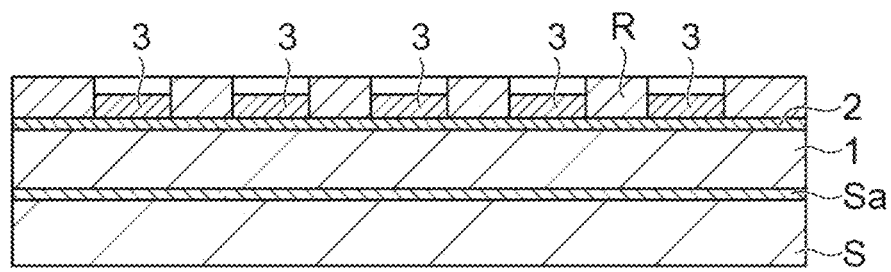
Figure 2A:
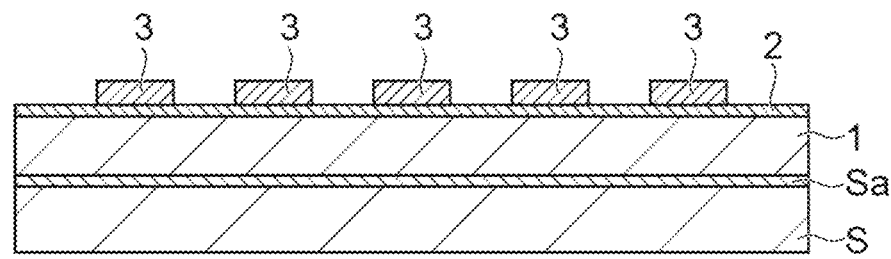
FIG. 2A to FIG. 2C are cross-sectional views schematically illustrating the manufacturing process of the wiring board according to the embodiment of the present disclosure.
Figure 2B:
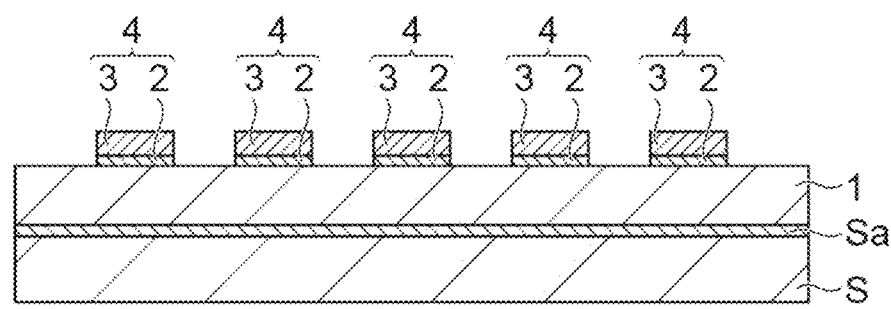
Figure 2C:
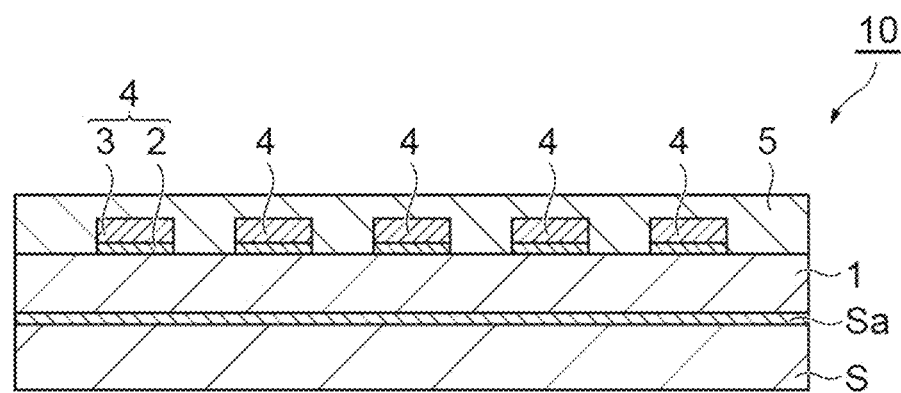

FIG. 1A to FIG. 1D and FIG. 2A to FIG. 2C are cross-sectional views schematically illustrating a manufacturing process of a wiring board. A wiring board 10 schematically illustrated in FIG. 2C is particularly suitable for an embodiment in which micronization and higher pin count are required, and is suitable particularly for an embodiment of packaging in which an interposer is required for mixedly mounting different kinds of chips. More specifically, the manufacturing method according to the present embodiment is suitable for an embodiment of packaging in which the spacing of pins is 200 μm or less (more specifically, for example, 30 to 100 μm) and the number of pins is 500 or more (more specifically, for example, 1000 to 10000).

When the nickel content rate of a region (a seed layer 2) that is in contact with a first insulating material layer 1 in a metal wiring 4 is 0.25 to 20% by mass, the metal wiring 4 has excellent adhesiveness with respect to the first insulating material layer 1 without surface roughening of the first insulating material layer 1 by a desmear treatment solution. Therefore, a micro wiring can be formed on the surface of the first insulating material layer 1, and a transmission loss in a high frequency can be sufficiently decreased.

The wiring board 10 is manufactured through the following steps, as roughly classified:

(1) a step of forming the first insulating material layer 1 on a support substrate S;
(2) a step of forming the seed layer 2 (metal layer) on the surface of the first insulating material layer 1;
(3) a step of forming a wiring part 3 (conductive part) on the seed layer 2; and
(4) a step of forming a second insulating material layer 5 to cover the metal wiring 4.

<(1) Step of Forming First Insulating Material Layer on Support Substrate>

The first insulating material layer 1 is formed on the support substrate S (FIG. 1A). The support substrate S is not particularly limited, and examples thereof include a silicon plate, a glass plate, an SUS (stainless steel) plate, a glass cloth-containing substrate, a semiconductor element-containing sealing resin, and a high stiffness substrate is preferred. The support substrate S illustrated in FIG. 1A has a conductive layer Sa formed on a surface on which the first insulating material layer 1 is formed. As the support substrate S, a support substrate having no conductive layer Sa formed or a support substrate having a wiring and/or a pad on a surface instead of the conductive layer Sa may be used.

The thickness of the support substrate S is preferably in a range of 0.2 mm to 2.0 mm. When the thickness thereof is less than 0.2 mm, handling of the support substrate S becomes difficult; on the other hand, when the thickness thereof is more than 2.0 mm, a material cost of the support substrate S tends to increase. The support substrate S may be wafer-shaped or panel-shaped. The size thereof is not particularly limited, and a wafer having a diameter of 200 mm, 300 mm, or 450 mm or a rectangular panel having a side of 300 to 700 mm is preferably used.

A material constituting the first insulating material layer 1 may be a photosensitive resin material and may be a thermosetting resin material. As these insulating materials, a liquid or film-shaped insulating material is exemplified, and from the viewpoint of film thickness flatness and the cost, a film-shaped insulating material is preferred. Furthermore, from the viewpoint that a micronized wiring can be formed, the insulating material preferably contains a filler having an average particle diameter of 500 nm or less (more preferably 50 to 200 nm). The content of the filler of the insulating material is preferably 0 to 70 parts by mass and more preferably 10 to 50 parts by mass with respect to 100 parts by mass of the insulating material excluding the filler.

In the case of using a film-shaped insulating material, a lamination step thereof is preferably performed at a temperature as low as possible, and an insulative film capable of being laminated at 40° C. to 120° C. is preferably adopted. In the case of an insulative film having a temperature enabling lamination of lower than 40° C., there are tendencies that tackiness is strong at normal temperature (about 25° C.) and handling property deteriorates, and in the case of a photosensitive insulative film having a temperature enabling lamination of higher than 120° C., there is a tendency that warpage becomes large after lamination.

The thermal expansion coefficient of the first insulating material layer 1 after curing is preferably $80 \times 10^{-6}$/K (kelvin) or less from the viewpoint of suppressing warpage, and is more preferably $70 \times 10^{-6}$/K or less from the viewpoint of obtaining high reliability. Furthermore, from the viewpoint of obtaining a stress relaxation property of the insulating material and a high-definition pattern, the thermal expansion coefficient is preferably $20 \times 10^{-6}$/K or more. The thickness of the first insulating material layer 1 is preferably 10 μm or less, more preferably 5 μm or less, and further preferably 3 μm or less. Furthermore, from the viewpoint of insulation reliability, the thickness of the first insulating material layer 1 is preferably 0.5 μm or more.

For example, an opening (not illustrated) reaching the conductive layer Sa may be provided in the first insulating material layer 1 according to the use application or embodiments of the wiring board 10. In the case of forming the first insulating material layer 1 by a photosensitive resin composition, the opening may be provided, for example, by photolithography. In the case of forming the first insulating material layer 1 by a thermosetting resin composition, the opening may be provided, for example, by laser processing.

From the viewpoint of decreasing a transmission loss in a high frequency, the surface of the first insulating material layer 1 is preferably as flat as possible. That is, the arithmetic average roughness Ra of the surface of the first insulating material layer 1 is 100 nm or less, preferably 80 nm or less, and more preferably 55 nm or less. The lower limit value of the arithmetic average roughness Ra of the surface of the first insulating material layer 1 is, for example, 5 nm and may be 10 nm or 20 nm. The arithmetic average roughness Ra can be measured using a laser microscope. The following procedure may be adopted for obtaining the arithmetic average roughness Ra of the surface of the first insulating layer 1 from the cross-section of the laminate including the first insulating layer 1. That is, a difference (Rz value) between the projection and the recess is measured from surfaces of a plurality of samples in which values of the arithmetic average roughness Ra are known. A standard curve is created on the basis of the measured Rz value and the known Ra value. The difference (Rz value) between the projection and the recess in the cross-section of the first insulating layer 1 in which the arithmetic average roughness Ra should be obtained is measured, and the arithmetic average roughness Ra can be obtained from this measurement value and the standard curve.

<(2) Step of Forming Seed Layer on Surface of First Insulating Material Layer>

The seed layer 2 is formed on the surface of the first insulating material layer 1 by electroless plating containing at least copper (FIG. 1B). As described above, since the surface of the first insulating material layer 1 is preferably as flat as possible, it is preferable that a roughening treatment with a desmear treatment solution is not performed with respect to the surface of the first insulating material layer 1 before the seed layer 2 is formed. Although the surface of the first insulating material layer 1 is not roughened, it is preferable to form a modified region (not illustrated) having voids communicating with the interior from the surface of the first insulating material layer 1 on the surface layer of the first insulating material layer 1.

By adsorbing an electroless plating catalyst to the first insulating material layer 1 in which the modified region is formed, the catalyst enters the voids of the modified region. When the seed layer 2 is formed by electroless plating in this state, the electroless plating formed in the voids of the modified region acts like the root of the plant and is speculated to contribute to improvement in adhesiveness between the first insulating material layer 1 and the seed layer 2. Such a modified region may be formed by performing at least one modification treatment selected from the group consisting of irradiation of active energy rays, an ozone water treatment, a corona discharge treatment, and a plasma treatment with respect to the surface of the first insulating material layer 1, before the seed layer 2 is formed. Any active energy rays may be used as long as they do not excessively roughen the surface of the first insulating material layer 1, and examples thereof include ultraviolet rays, electron beams, α rays, f rays, and γ rays. By adjusting the amount of irradiation of active energy rays and the intensity thereof, the arithmetic average roughness Ra of the surface of the first insulating material layer 1 can be maintained to 100 nm or less.

The seed layer 2 is formed through the following steps. First, the surface of the first insulating material layer 1 is cleaned with a pretreatment liquid. The pretreatment liquid may be a commercially available alkaline pretreatment liquid containing sodium hydroxide or potassium hydroxide. The pretreatment is performed at concentration of sodium hydroxide or potassium hydroxide of 1 to 30% by mass.

The pretreatment is performed for an immersion time in the pretreatment liquid of 1 to 60 minutes. The pretreatment is performed at an immersion temperature in the pretreatment liquid of 25° C. to 80° C. After the pretreatment, in order to remove the redundant pretreatment liquid, cleaning may be performed with city water, pure water, ultrapure water, or an organic solvent.

After the removal of the pretreatment liquid, in order to remove alkali ions from the surface of the first insulating material layer 1, immersion cleaning is performed with an acidic aqueous solution. The acidic aqueous solution may be a sulfuric acid aqueous solution, and immersion cleaning is performed at a concentration of 1 to 20% by mass for an immersion time of 1 to 60 minutes. In order to remove the acidic aqueous solution, cleaning may be performed with city water, pure water, ultrapure water, or an organic solvent.

Subsequently, palladium that becomes an electroless plating catalyst is attached to the surface of the first insulating material layer 1 after the immersion cleaning. The palladium may be a commercially available palladium-tin colloidal solution, an aqueous solution containing palladium ions, a palladium ion suspension liquid, or the like, and is preferably an aqueous solution containing palladium ions effectively adsorbed to a modified layer. At the time of immersion in an aqueous solution containing palladium ions, immersion is performed at a temperature of the aqueous solution containing palladium ions of 25° C. to 80° C. and an immersion time for adsorption of 1 to 60 minutes. After palladium ions are adsorbed, in order to remove the palladium ions, cleaning may be performed with city water, pure water, ultrapure water, or an organic solvent.

After adsorption of the palladium ions, activation for causing the palladium ions to act as a catalyst is performed. A reagent causing the palladium ions to activate may be a commercially available activating agent (activation treatment liquid). The activation is performed at a temperature of the activating agent to be used in immersion for activating the palladium ions of 25° C. to 80° C. and an immersion time for activation of 1 to 60 minutes. After the activation of the palladium ions, in order to remove the redundant activating agent, cleaning may be performed with city water, pure water, ultrapure water, or an organic solvent.

Subsequently, the seed layer 2 is formed by electroless plating of the surface of the first insulating material layer 1. The seed layer 2 becomes a power supply layer for electrolytic plating to be performed in the step (3). The thickness of the seed layer 2 is preferably 20 to 200 nm, more preferably 40 to 200 nm, and further preferably 60 to 200 nm.

The nickel content rate of the seed layer 2 is 0.25 to 20% by mass, and may be, for example, 3 to 20% by mass or 0.25 to 3% by mass. The nickel content rate of the seed layer 2 can be set, for example, by adjusting the nickel content rate of the electroless plating solution. When the nickel content rate of the seed layer 2 is 0.25% by mass or more, the adhesiveness between the first insulating material layer 1 and the seed layer 2 can be sufficiently secured; on the other hand, when the nickel content rate is 20% by mass or less, a transmission loss in a high frequency can be sufficiently decreased.

Examples of the electroless plating include electroless pure copper plating (purity of copper: 99% by mass or more) and electroless copper-nickel-phosphorus plating (nickel content rate: 1 to 10% by mass, phosphorus content: 1 to 13% by mass). The electroless copper-nickel-phosphorus plating solution may be a commercially available plating solution. As commercially available products of such a plating solution, for example, an electroless copper-nickel-phosphorus plating solution (manufactured by JCU CORPORATION, trade name "AISL-570") can be mentioned. The electroless copper-nickel-phosphorus plating is performed in an electroless copper-nickel-phosphorus plating solution set at 60° C. to 90° C.

An electroless copper plating solution having a nickel content rate of 0.1 to 1% by mass may be used in the formation of the seed layer 2. Examples of commercially available products of such a plating solution include electroless copper plating solutions (trade names "Copper Solution Printoganth MV TP1", "Stabilizer Printoganth MV TP1", "Basic Printoganth MV TP1", "Moderator Printoganth MV TP1", and "Reducer Cu" manufactured by Atotech Japan K.K.). The electroless copper plating is performed in an electroless copper plating solution set at 20° C. to 50° C.

After the electroless plating, in order to remove the redundant plating solution, cleaning may be performed with city water, pure water, ultrapure water, or an organic solvent. Furthermore, after the electroless plating, in order to increase the sticking force between the seed layer 2 and the first insulating material layer 1, thermal curing (annealing: age-curing treatment by heating) may be performed. The heating is preferably performed at a thermal curing temperature of 80° C. to 200° C. In order to further accelerate reactivity, the heating is performed more preferably at 120° C. to 200° C. and further preferably at 120° C. to 180° C. The thermal curing time is preferably 5 to 60 minutes, more preferably 10 to 60 minutes, and further preferably 20 to 60 minutes.

<(3) Step of Forming Wiring Part on Seed Layer>

A wiring-forming resist R is patterned on the surface of the seed layer 2 (see FIG. 1C). A commercially available resist may be used as the wiring-forming resist R, and for example, a negative-tone film-shaped photosensitive resist (manufactured by Hitachi Chemical Co., Ltd., Photec RY-5107UT) can be used. The resist pattern may be provided with an opening for wiring formation and, as necessary, other openings. That is, a resist is formed using a roll laminator, a phototool having a pattern formed is then bonded thereto, exposure is performed using an exposure device, spray development is then performed by a sodium carbonate aqueous solution, and thereby a resist pattern can be formed. Note that, a positive-tone photosensitive resist may be used instead of a negative-tone photosensitive resist.

By supplying power to the seed layer 2, electrolytic copper plating is performed to form the wiring part 3 (see FIG. 1D). The thickness of the wiring part 3 is preferably 1 to 10 μm, more preferably 3 to 10 μm, and further preferably 5 to 10 μm.

After the electrolytic copper plating, the wiring-forming resist R is peeled off (see FIG. 2A). The peeling-off of the wiring-forming resist R may be performed using a commercially available peeling solution. The exposed seed layer 2 is removed by the peeling-off of the wiring-forming resist R (see FIG. 2B). Thereby, the metal wiring 4 configured by the seed layer 2 remaining on the surface of the first insulating material layer 1 and the wiring part 3 is formed. Along with the removal of the seed layer 2, palladium remaining below the seed layer 2 may be removed. The removal thereof may be performed using a commercially available removal liquid (etching solution), and specifically, an acidic etching solution (manufactured by JCU CORPORATION, BB-20, PJ-10, SAC-700W3C) is exemplified.

<(4) Step of Forming Second Insulating Material Layer to Cover Metal Wiring>

The second insulating material layer 5 is formed to cover the metal wiring 4 (see FIG. 2C). The material constituting the second insulating material layer 5 may be the same as or different from the material for the first insulating material layer.

Hereinbefore, the wiring board and the method for manufacturing the same have been described, but the present invention is not necessarily limited to the aforementioned embodiments and may be adequately modified within a scope not departing from the gist thereof. For example, in the above-described embodiments, the method for manufacturing a wiring board having one wiring layer (a layer including the metal wiring 4 and the second insulating material layer 5) has been exemplified, but a wiring board having a plurality of wiring layers may be manufactured by repeating a step of providing the seed layer on the surface of the wiring layer and a series of steps (3) and (4) described above.

EXAMPLES

The present disclosure will be more specifically described by means of the following Examples; however, the present invention is not limited to these examples.

Example 1

<Production of Photosensitive Resin Film>

A photosensitive resin film for an insulating material layer was produced as follows. First, a photosensitive resin composition was prepared using the following components.

Photoreactive resin containing a carboxyl group and an ethylenically unsaturated group: Acid-modified cresol novolac type epoxy acrylate (CCR-1219H, manufactured by Nippon Kayaku Co., Ltd., trade name) 50 parts by mass Photopolymerization initiator component: 2,4,6-Trimethylbenzoyl-diphenyl-phosphine oxide (Darocur TPO, manufactured by BASF Japan Ltd., trade name) and ethanone, 1-[9-ethyl-6-(2-methylbenzoyl)-9H-carbazol-3-yl]-,1-(o-acetyl oxime) (IRGACURE OXE-02, manufactured by BASF Japan Ltd., trade name) 5 parts by mass Thermal curing agent component: Biphenol type epoxy resin (YX-4000, manufactured by Mitsubishi Chemical Corporation, trade name) 10 parts by mass Inorganic filler component: average particle diameter: 50 nm, silane coupling treated with vinylsilane. The inorganic filler component was mixed to be 10 parts by volume with respect to 100 parts by volume of the resin component. Note that, the particle size distribution of the inorganic filler was measured using a dynamic light scattering-type Nanotrac particle size distribution analyzer "UPA-EX150" (manufactured by NIKKISO CO., LTD.) and a laser diffraction scattering-type Microtrac particle size distribution analyzer "MT-3100" (manufactured by NIKKISO CO., LTD.), and it was confirmed that the maximum particle diameter was 1 µm or less.

A solution of the above-described photosensitive resin composition was applied onto the surface of a polyethylene terephthalate film (manufactured by TEIJIN LIMITED, trade name: G2-16, thickness: 16 µm). The coating film was dried at 100° C. for about 10 minutes using a hot air convection type dryer. Thereby, a photosensitive resin film having a thickness of 10 µm was obtained.

<Formation of Wiring Layer Having Micro Wiring>

As a support substrate, a glass cloth-containing substrate (size: 200 mm square, thickness: 1.5 mm) having a copper layer (thickness: 20 µm) formed on the surface was prepared.

Step (1a)

In order to form the first insulating material layer on the surface of the copper layer of the above-described support substrate, the above-described photosensitive resin film was laminated. Specifically, first, the photosensitive resin film was placed on the surface of the copper layer of the support substrate. Next, this product was pressed using a press type vacuum laminator (MVLP-500, manufactured by MEIKI CO., LTD.). The press conditions were set to a hot pressing plate temperature of 80° C., a vacuuming time of 20 seconds, a laminate press time of 60 seconds, an atmospheric pressure of 4 kPa or less, and a crimping pressure of 0.4 MPa.

Step (1b)

By performing an exposure treatment and a development treatment to the pressed photosensitive resin film (first insulating material layer), an opening reaching the copper layer of the support substrate was provided. The exposure was performed in a state where the phototool having a pattern formed is bonded onto the first insulating material layer. The exposure was performed using an i-line stepper exposure machine (product name: S6CK type exposure machine, lens: ASC3(Ck), manufactured by CERMA PRECISION, INC.) at an energy dose of 30 mJ/cm². Next, spray development was performed by 1% by mass of a sodium carbonate aqueous solution set at 30° C. for 45 seconds to provide an opening. Next, the surface of the developed first insulating material layer was subjected to post-UV exposure using a mask exposure machine (EXM-1201 type exposure machine, manufactured by ORC MANUFACTURING CO., LTD., main wavelength of ultraviolet rays: 365 nm) at an energy dose of 2000 mJ/cm². Next, the thermal curing was performed in a clean oven at 170° C. for 1 hour.

Step (1c)

The first insulating material layer was irradiated with ultraviolet rays using an ultraviolet irradiation device (SSP-16, manufactured by SEN LIGHTS Corporation, main wavelength of ultraviolet rays: 254 nm). Thereby, the surface of the first insulating material layer was modified. The distance from an ultraviolet lamp to the surface of the first insulating material layer was set to 40 mm, and the ultraviolet ray irradiation time was set to 30 seconds.

Step (2)

The seed layer was formed on the surface of the first insulating material layer by electroless copper plating. That is, first, as alkali cleaning, the substrate was immersed in 110 mL/L of an aqueous solution of an alkali cleaner (manufactured by JCU CORPORATION, trade name: EC-B) at 50° C. for 5 minutes, and then immersed in pure water for 1 minute. Next, the substrate was immersed in a mixed solution of a conditioning liquid (manufactured by JCU CORPORATION, trade name: PB-200) and EC-B (PB-200 concentration: 70 mL/L, EC-B concentration: 2 mL/L) as a conditioner at 50° C. for 5 minutes, and then immersed in pure water for 1 minute. Next, as soft etching, the substrate was immersed in a mixed solution of a soft etching liquid (manufactured by JCU CORPORATION, trade name: PB-228) and 98% sulfuric acid (PB-228 concentration: 100 g/L, sulfuric acid concentration: 50 mL/L) at 30° C. for 2 minutes, and then immersed in pure water for 1 minute. Next, as desmutting, the substrate was immersed in 10% sulfuric acid at room temperature for 1 minute. Next, the substrate was immersed in a mixed solution of a reagent 1 for catalyzing (manufactured by JCU CORPORATION, trade name: PC-BA), a reagent 2 for catalyzing (manufactured by JCU CORPORATION, trade name: PB-333), and EC-B (PC-BA concentration: 5 g/L, PB-333 concentration: 40 mL/L, EC-B concentration: 9 mL/L) as a catalyzer at 60° C. for 5 minutes, and then immersed in pure water for 1 minute. Next, the substrate was immersed in a mixed solution of a reagent for an accelerator (manufactured by JCU CORPORATION, trade name: PC-66H) and PC-BA (PC-66H concentration: 10 mL/L, PC-BA concentration: 5 g/L) as an accelerator at 30° C. for 5 minutes, and then immersed in pure water for 1 minute.

Next, as electroless copper plating, the substrate was immersed in a mixed solution of electroless copper-nickel-phosphorus plating solutions (manufactured by JCU CORPORATION, trade name: AISL-570B, AISL-570C, and AISL-570MU) and PC-BA (AISL-570B concentration: 70 mL/L, AISL-570C concentration: 24 mL/L, AISL-570MU concentration: 50 mL/L, PC-BA concentration: 13 g/L) at 60° C. for 7 minutes, and then immersed in pure water for 1 minute. Thereafter, drying was performed by a hot plate set at 85° C. for 5 minutes. Next, the thermal annealing was performed in an oven set at 180° C. for 1 hour.

Step (3a)

A wiring-forming resist (manufactured by Hitachi Chemical Co., Ltd., RY-5107UT) was vacuum-laminated on a 200 mm×200 mm substrate on which electroless copper is formed, using a vacuum laminator (manufactured by Nichigo Morton Co., Ltd., V-160). The lamination temperature was set to 110° C., the lamination time was set to 60 seconds, and the lamination pressure was set to 0.5 MPa.

After the vacuum lamination, the substrate was left to stand for 1 day, and the wiring-forming resist was exposed using an i-line stepper exposure machine (product name: S6CK type exposure machine, lens: ASC3(Ck), manufactured by CERMA PRECISION, INC.). The exposure amount was set to 140 mJ/cm$^2$, and the focus was set to −15 μm. After the exposure, the substrate was left to stand for 1 day, the protective film of the wiring-forming resist was peeled off, and development was performed using a spray developing machine (manufactured by Mikasa Co., Ltd., AD-3000). A developer used was a 1.0% sodium carbonate aqueous solution, the development temperature was set to 30° C., and the spray pressure was set to 0.14 MPa. Thereby, resist patterns for forming wirings with the following L/S (line/space) were formed on the seed layer.

L/S=10 μm/10 μm (number of wirings: 10)
L/S=7 μm/7 μm (number of wirings: 10)
L/S=5 μm/5 μm (number of wirings: 10)
L/S=3 μm/3 μm (number of wirings: 10)
L/S=2 μm/2 μm (number of wirings: 10)

Step (3b)

The substrate was immersed in 100 mL/L of an aqueous solution (manufactured by Okuno Chemical Industries Co., Ltd., trade name: ICP CLAEN S-135) as a cleaner at 50° C. for 1 minute, immersed in pure water at 50° C. for 1 minute, immersed in pure water at 25° C. for 1 minute, and then immersed in a 10% sulfuric acid aqueous solution at 25° C. for 1 minute. Next, electrolytic plating was performed in an aqueous solution, which is obtained by adding 0.25 mL of hydrochloric acid, 10 mL of TOP LUCINA GT-3 (trade name) manufactured by Okuno Chemical Industries Co., Ltd., 1 mL of TOP LUCINA GT-2 (trade name) manufactured by Okuno Chemical Industries Co., Ltd. to 7.3 L of an aqueous solution of 120 g/L of copper sulfate pentahydrate and 220 g/L of 96% sulfuric acid, at 25° C. under the condition of a current density of 1.5 A/dm$^2$ for 10 minutes. Thereafter, the substrate was immersed in pure water at 25° C. for 5 minutes and then dried by a hot plate set at 80° C. for 5 minutes.

Step (3c)

The wiring-forming resist was peeled off using a spray developing machine (manufactured by Mikasa Co., Ltd., AD-3000). A peeling solution used was a 2.38% TMAH aqueous solution, the peeling temperature was set to 40° C., and the spray pressure was set to 0.2 MPa.

Step (3d)

The electroless copper as the seed layer and the palladium catalyst were removed. As electroless Cu etching, the substrate was immersed in an aqueous solution of an etching solution (manufactured by JCU CORPORATION, SAC-700W3C), 98% sulfuric acid, 35% hydrogen peroxide solution, copper sulfate pentahydrate (SAC-700W3C concentration: 5% by volume, sulfuric acid concentration: 4% by volume, hydrogen peroxide concentration: 5% by volume, copper sulfate pentahydrate concentration: 30 g/L) at 35° C. for 1 minute. Next, as the removal of the palladium catalyst, the substrate was immersed in FL aqueous solutions (manufactured by JCU CORPORATION, FL-A: 500 mL/L, FL-B: 40 mL/L) at 50° C. for 1 minute. Thereafter, the substrate was immersed in pure water at 25° C. for 5 minutes and then dried by a hot plate set at 80° C. for 5 minutes. A wiring board according to Example 1 was obtained through these steps.

Example 2

In the step (2), the seed layer was formed on the surface of the insulating material layer using an electroless copper-nickel-phosphorus plating solution in a state where the nickel concentrate is more increased than that in Example 1. That is, first, as alkali cleaning, the substrate was immersed in 110 mL/L of an aqueous solution of an alkali cleaner (manufactured by JCU CORPORATION, trade name: EC-B) at 50° C. for 5 minutes, and then immersed in pure water for 1 minute. Next, the substrate was immersed in a mixed solution of a conditioning liquid (manufactured by JCU CORPORATION, trade name: PB-200) and EC-B (PB-200 concentration: 70 mL/L, EC-B concentration: 2 mL/L) as a conditioner at 50° C. for 5 minutes, and then immersed in pure water for 1 minute. Next, as soft etching, the substrate was immersed in a mixed solution of a soft etching liquid (manufactured by JCU CORPORATION, trade name: PB-228) and 98% sulfuric acid (PB-228 concentration: 100 g/L, sulfuric acid concentration: 50 mL/L) at 30° C. for 2 minutes, and then immersed in pure water for 1 minute. Next, as desmutting, the substrate was immersed in 10% sulfuric acid at room temperature for 1 minute. Next, the substrate was immersed in a mixed solution of a reagent 1 for catalyzing (manufactured by JCU CORPORATION, trade name: PC-BA), a reagent 2 for catalyzing (manufactured by JCU CORPORATION, trade name: PB-333), and EC-B (PC-BA concentration: 5 g/L, PB-333 concentration: 40 mL/L, EC-B concentration: 9 mL/L) as a catalyzer at 60° C. for 5 minutes, and then immersed in pure water for 1 minute. Next, the substrate was immersed in a mixed solution of a reagent for an accelerator (manufactured by JCU CORPORATION, trade name: PC-66H) and PC-BA (PC-66H concentration: 10 mL/L, PC-BA concentration: 5 g/L) as an accelerator at 30° C. for 5 minutes, and then immersed in pure water for 1 minute.

Next, as electroless copper plating, the substrate was immersed in a mixed solution of electroless copper-nickel-phosphorus plating solutions (manufactured by JCU CORPORATION, trade name: AISL-570B, AISL-570C, and AISL-570MU), PC-BA, and nickel sulfate hexahydrate (AISL-570B concentration: 70 mL/L, AISL-570C concentration: 24 mL/L, AISL-570MU concentration: 50 mL/L, PC-BA concentration: 13 g/L, nickel sulfate hexahydrate concentration: 1 g/L) at 60° C. for 7 minutes, and then immersed in pure water for 1 minute. Thereafter, drying was performed by a hot plate set at 85° C. for 5 minutes. Next, the thermal annealing was performed in an oven set at 180° C. for 1 hour. The subsequent steps were performed in the same manner as in Example 1 to manufacture a wiring board.

Example 3

In the step (2), the seed layer was formed on the surface of the insulating material layer using an electroless copper-nickel-phosphorus plating solution in a state where the nickel concentrate is more increased than that in Example 2. That is, first, as alkali cleaning, the substrate was immersed in 110 mL/L of an aqueous solution of an alkali cleaner (manufactured by JCU CORPORATION, trade name: EC-B) at 50° C. for 5 minutes, and then immersed in pure water for 1 minute. Next, the substrate was immersed in a mixed solution of a conditioning liquid (manufactured by JCU CORPORATION, trade name: PB-200) and EC-B (PB-200 concentration: 70 mL/L, EC-B concentration: 2 mL/L) as a conditioner at 50° C. for 5 minutes, and then immersed in pure water for 1 minute. Next, as soft etching, the substrate was immersed in a mixed solution of a soft etching liquid (manufactured by JCU CORPORATION, trade name: PB-228) and 98% sulfuric acid (PB-228 concentration: 100 g/L, sulfuric acid concentration: 50 mL/L) at 30° C. for 2 minutes, and then immersed in pure water for 1 minute. Next, as desmutting, the substrate was immersed in 10% sulfuric acid at room temperature for 1 minute. Next, the substrate was immersed in a mixed solution of a reagent 1 for catalyzing (manufactured by JCU CORPORATION, trade name: PC-BA), a reagent 2 for catalyzing (manufactured by JCU CORPORATION, trade name: PB-333), and EC-B (PC-BA concentration: 5 g/L, PB-333 concentration: 40 mL/L, EC-B concentration: 9 mL/L) as a catalyzer at 60° C. for 5 minutes, and then immersed in pure water for 1 minute. Next, the substrate was immersed in a mixed solution of a reagent for an accelerator (manufactured by JCU CORPORATION, trade name: PC-66H) and PC-BA (PC-66H concentration: 10 mL/L, PC-BA concentration: 5 g/L) as an accelerator at 30° C. for 5 minutes, and then immersed in pure water for 1 minute. Next, as electroless copper plating, the substrate was immersed in a mixed solution of electroless copper-nickel-phosphorus plating solutions (manufactured by JCU CORPORATION, trade name: AISL-570B, AISL-570C, and AISL-570MU), PC-BA, and nickel sulfate hexahydrate (AISL-570B concentration: 70 mL/L, AISL-570C concentration: 24 mL/L, AISL-570MU concentration: 50 mL/L, PC-BA concentration: 13 g/L, nickel sulfate hexahydrate concentration: 5 g/L) at 60° C. for 7 minutes, and then immersed in pure water for 1 minute. Thereafter, drying was performed by a hot plate set at 85° C. for 5 minutes. Next, the thermal annealing was performed in an oven set at 180° C. for 1 hour. The subsequent steps were performed in the same manner as in Example 1 to manufacture a wiring board.

Example 4

In the step (2), the seed layer was formed on the surface of the insulating material layer using an electroless copper plating solution. That is, first, as alkali cleaning, the substrate was immersed in an aqueous solution prepared so that an alkali cleaner (manufactured by Atotech Japan K.K., trade name: Cleaner Securiganth 902) became 40 mL/L and sodium hydroxide became 20 mL/L, at 60° C. for 5 minutes, and then immersed in pure water for 1 minute. Next, as neutralization, the substrate was immersed in 10 mL/L of a sulfuric acid aqueous solution at 25° C. for 2 minutes, and then immersed in pure water for 1 minute. Next, as pre-dipping, the substrate was immersed in an aqueous solution prepared so that a conditioning liquid (manufactured by Atotech Japan K.K., trade name: Predip Neoganth B) became 20 mL/L and sulfuric acid became 1 mL/L, at 25° C. for 1 minute. Next, the substrate was immersed in an aqueous solution prepared so that a reagent for catalyzing (manufactured by Atotech Japan K.K., trade name: Activator Neoganth 834) became 40 mL/L, boric acid became 5 g/L, and sodium hydroxide became 4 g/L, as a catalyzer, at 35° C. for 10 minutes, and then immersed in pure water for 1 minute. Next, the substrate was immersed in an aqueous solution prepared so that a reagent for an accelerator (manufactured by Atotech Japan K.K., trade name: Reducer Neoganth WA) became 5 mL/L and boric acid became 5 g/L, as an accelerator, at 30° C. for 5 minutes, and then immersed in pure water for 1 minute.

Next, as electroless copper plating, the substrate was immersed in an aqueous solution prepared so that an electroless copper plating solution (manufactured by Atotech Japan K.K., trade name: Basic Printoganth MV TP1) became 140 mL/L, an electroless copper plating solution (manufactured by Atotech Japan K.K., trade name: Copper Solution Printoganth MV TP1) became 85 mL/L, an electroless copper plating solution (manufactured by Atotech Japan K.K., trade name: Moderator Printoganth MV TP1) became 3 mL/L, an electroless copper plating solution (manufactured by Atotech Japan K.K., trade name: Stabilizer Printoganth MV TP1) became 0.6 mL/L, an electroless copper plating solution (manufactured by Atotech Japan K.K., trade name: Reducer Cu) became 16 mL/L, and sodium hydroxide became 0.5 g/L, at 30° C. for 10 minutes, and then immersed in pure water for 1 minute. Thereafter, drying was performed by a hot plate set at 85° C. for 5 minutes. Next, the thermal annealing was performed in an oven set at 180° C. for 1 hour.

Example 5

<Production of Thermosetting Resin Film>

A thermosetting resin film for a first insulating material layer was produced as follows. First, a thermosetting resin composition was prepared using the following components.

Epoxy resin: Biphenyl aralkyl type epoxy resin, product name NC-3000H (manufactured by Nippon Kayaku Co., Ltd.) 70 parts by mass Curing agent: Curing agent A synthesized as follows 30 parts by mass Inorganic filler component: average particle diameter: 50 nm, silane coupling treated with vinylsilane. The inorganic filler component was mixed to be 30 parts by mass with respect to 100 parts by mass of the resin component. Note that, the particle size distribution of the inorganic filler was measured using a dynamic light scattering-type Nanotrac particle size distribution analyzer "UPA-EX150" (manufactured by NIKKISO CO., LTD.) and a laser diffraction scattering-type Microtrac particle size distribution analyzer "MT-3100" (manufactured by NIKKISO CO., LTD.), and it was confirmed that the maximum particle diameter was 1 μm or less.

<Synthesis of Curing Agent A>

A reaction container (volume: 2 L) equipped with a thermometer, a stirrer, and a water quantity meter having a reflux condenser was prepared. The following components were put in this reaction container and reacted at 140° C. for 5 hours.

Bis(4-aminophenyl)sulfone: 26.40 g
2,2'-Bis[4-(4-maleimidophenoxy)phenyl]propane: 484.50 g
p-Aminobenzoic acid: 29.10 g
Dimethylacetamide: 360.00 g Thereby, a solution of a curing agent A having a sulfone group in the molecular main chain and having an acidic substituent and an unsaturated N-substituted maleimide group was obtained.

A solution of the above-described thermosetting resin composition was applied onto the surface of a polyethylene terephthalate film (manufactured by TEIJIN LIMITED, trade name: G2-16, thickness: 16 μm). This product was dried at 100° C. for about 10 minutes using a hot air convection type dryer. Thereby, a thermosetting resin film having a thickness of 10 μm was obtained.

<Formation of Wiring Layer Having Micro Wiring>

As a support substrate, a glass cloth-containing substrate (size: 200 mm square, thickness: 1.5 mm) having a copper layer (thickness: 20 μm) formed on the surface was prepared.

Step (1a)

In order to form the first insulating material layer on the surface of the copper layer of the above-described wiring board, the above-described thermosetting resin film was laminated. Specifically, first, the thermosetting resin film was placed on the surface of the copper layer of the support substrate. Next, this product was pressed using a press type vacuum laminator (MVLP-500, manufactured by MEIKI CO., LTD.). The press conditions were set to a hot pressing plate temperature of 70° C., a vacuuming time of 20 seconds, a laminate press time of 40 seconds, an atmospheric pressure of 4 kPa or less, and a crimping pressure of 0.5 MPa. Next, additional pressing was performed using a pressing machine. Regarding the pressing condition, the temperature was increased to 220° C. for a pressing time between 0 to 60 minutes, maintained at 220° C. for a pressing time between 60 to 190 minutes, and decreased to 25° C. for a pressing time between 190 to 220 minutes. The pressing pressure was set to 2.0 MPa and the atmospheric pressure was set to 4 kPa.

Step (1b)

The pressed thermosetting resin film (first insulating material layer) was subjected to via machining using a laser processing machine (product name: LC-2K21, manufactured by Via Mechanics), and thereby an opening was provided to reach the copper layer of the support substrate. Regarding the via machining condition, the aperture diameter was set to 6.5 mm, the output was set to 6.3 W, the pulse pitch was set to 20 μm×3 times, and the mode was set to a burst mode.

Step (1c)

The first insulating material layer was irradiated with ultraviolet rays using an ultraviolet irradiation device (SSP-16, manufactured by SEN LIGHTS Corporation, main wavelength of ultraviolet rays: 254 nm). Thereby, the surface of the first insulating material layer was modified. The distance from an ultraviolet lamp to the surface of the first insulating material layer was set to 40 mm, and the ultraviolet ray irradiation time was set to 30 seconds.

Step (2)

The seed layer was formed on the surface of the first insulating material layer by electroless copper plating. That is, first, as alkali cleaning, the substrate was immersed in an aqueous solution prepared so that an alkali cleaner (manufactured by Atotech Japan K.K., trade name: Cleaner Securiganth 902) became 40 mL/L and sodium hydroxide became 20 mL/L, at 60° C. for 5 minutes, and then immersed in pure water for 1 minute. Next, as neutralization, the substrate was immersed in 10 mL/L of a sulfuric acid aqueous solution at 25° C. for 2 minutes, and then immersed in pure water for 1 minute. Next, as pre-dipping, the substrate was immersed in an aqueous solution prepared so that a conditioning liquid (manufactured by Atotech Japan K.K., trade name: Predip Neoganth B) became 20 mL/L and sulfuric acid became 1 mL/L, at 25° C. for 1 minute. Next, the substrate was immersed in an aqueous solution prepared so that a reagent for catalyzing (manufactured by Atotech Japan K.K., trade name: Activator Neoganth 834) became 40 mL/L, boric acid became 5 g/L, and sodium hydroxide became 4 g/L, as a catalyzer, at 35° C. for 10 minutes, and then immersed in pure water for 1 minute. Next, the substrate was immersed in an aqueous solution prepared so that a reagent for an accelerator (manufactured by Atotech Japan K.K., trade name: Reducer Neoganth WA) became 5 mL/L and boric acid became 5 g/L, as an accelerator, at 30° C. for 5 minutes, and then immersed in pure water for 1 minute.

Next, as electroless copper plating, the substrate was immersed in an aqueous solution prepared so that an electroless copper plating solution (manufactured by Atotech Japan K.K., trade name: Basic Printoganth MV TP1) became 140 mL/L, an electroless copper plating solution (manufactured by Atotech Japan K.K., trade name: Copper Solution Printoganth MV TP1) became 85 mL/L, an electroless copper plating solution (manufactured by Atotech Japan K.K., trade name: Moderator Printoganth MV TP1) became 3 mL/L, an electroless copper plating solution (manufactured by Atotech Japan K.K., trade name: Stabilizer Printoganth MV TP1) became 0.6 mL/L, an electroless copper plating solution (manufactured by Atotech Japan K.K., trade name: Reducer Cu) became 16 mL/L, sodium hydroxide became 0.5 g/L, at 30° C. for 10 minutes, and then immersed in pure water for 1 minute. Thereafter, drying was performed by a hot plate set at 85° C. for 5 minutes. Next, the thermal annealing was performed in an oven set at 180° C. for 1 hour. The subsequent steps were performed in the same manner as in Example 1 to manufacture a wiring board.

Examples 6 and 7

In the step (2), the seed layer was formed on the surface of the first insulating material layer using an electroless copper-nickel-phosphorus plating solution. That is, first, as alkali cleaning, the substrate was immersed in 110 mL/L of an aqueous solution of an alkali cleaner (manufactured by JCU CORPORATION, trade name: EC-B) at 50° C. for 5 minutes, and then immersed in pure water for 1 minute. Next, the substrate was immersed in a mixed solution of a conditioning liquid (manufactured by JCU CORPORATION, trade name: PB-200) and EC-B (PB-200 concentration: 70 mL/L, EC-B concentration: 2 mL/L) as a conditioner at 50° C. for 5 minutes, and then immersed in pure water for 1 minute. Next, as soft etching, the substrate was immersed in a mixed solution of a soft etching liquid (manufactured by JCU CORPORATION, trade name: PB-228) and 98% sulfuric acid (PB-228 concentration: 100 g/L, sulfuric acid concentration: 50 mL/L) at 30° C. for 2 minutes, and then immersed in pure water for 1 minute. Next, as desmutting, the substrate was immersed in 10% sulfuric acid at room temperature for 1 minute. Next, the substrate was immersed in a mixed solution of a reagent 1 for catalyzing (manufactured by JCU CORPORATION, trade name: PC-BA), a reagent 2 for catalyzing (manufactured by JCU CORPORATION, trade name: PB-333), and EC-B (PC-BA concentration: 5 g/L, PB-333 concentration: 40 mL/L, EC-B concentration: 9 mL/L) as a catalyzer at 60° C. for 5 minutes, and then immersed in pure water for 1 minute. Next, the substrate was immersed in a mixed solution of a reagent for an accelerator (manufactured by JCU CORPORATION, trade name: PC-66H) and PC-BA (PC-66H concentration: 10 mL/L, PC-BA concentration: 5 g/L) as an accelerator at 30° C. for 5 minutes, and then immersed in pure water for 1 minute.

Next, as electroless copper plating, the substrate was immersed in a mixed solution of electroless copper-nickel-phosphorus plating solutions (manufactured by JCU CORPORATION, trade name: AISL-570B, AISL-570C, and AISL-570MU), PC-BA, and nickel sulfate hexahydrate (AISL-570B concentration: 70 mL/L, AISL-570C concentration: 24 mL/L, AISL-570MU concentration: 50 mL/L, PC-BA concentration: 13 g/L, nickel sulfate hexahydrate concentration: 1 g/L) at 60° C. for 7 minutes, and then immersed in pure water for 1 minute. Thereafter, drying was performed by a hot plate set at 85° C. for 5 minutes. Next, the thermal annealing was performed in an oven set at 180° C. for 1 hour. The subsequent steps were performed in the same manner as in Examples 4 and 5 to manufacture a wiring board.

Examples 8 to 10

In the step (2), wiring boards were manufactured in the same manner as in Example 7, except that an electroless copper-nickel-phosphorus plating solution in a state where the nickel concentrate is more increased than that in Example 7 was used.

Comparative Example 1

A wiring board was obtained in the same manner as in Example 1, except that, in the step (1c), the surface of the first insulating material layer was modified (roughened) using a chemical liquid used in the desmear treatment instead of irradiation of ultraviolet rays, and the seed layer was formed using an electroless pure copper plating solution instead of the electroless copper-nickel-phosphorus plating solution.

The treatment by a chemical liquid used in the desmear treatment was performed as follows. First, for a swelling treatment, the substrate was immersed in 40 mL/L of a sweller (manufactured by Atotech, trade name: Cleaner Securiganth 902) at 70° C. for 5 minutes. Thereafter, the substrate was immersed in pure water for 1 minute. Next, for a roughening treatment, the substrate was immersed in 40 mL/L of a desmear solution (manufactured by Atotech, trade name: Compact CP) at 70° C. for 10 minutes. Thereafter, the substrate was immersed in pure water for 1 minute. Thereafter, the substrate was immersed in pure water at 25° C. for 5 minutes and then dried by a hot plate set at 80° C. for 5 minutes.

Comparative Example 2

In the step (2), the seed layer was formed on the surface of the first insulating material layer using an electroless nickel plating solution instead of the electroless copper-nickel-phosphorus plating solution used in Example 1. That is, first, as alkali cleaning, the substrate was immersed in 40 mL/L of an aqueous solution of an alkali cleaner (manufactured by JCU CORPORATION, trade name: ES-100) at 40° C. for 2 minutes, and then immersed in pure water for 1 minute. Next, as a conditioner, the substrate was immersed in 70 mL/L of an aqueous solution of a conditioning liquid (manufactured by JCU CORPORATION, trade name: ES-200) at 50° C. for 2 minutes, and then immersed in pure water for 1 minute. Next, the substrate was immersed in 100 mL/L of an aqueous solution of a reagent for catalyzing (manufactured by JCU CORPORATION, trade name: ES-300) as a catalyzer at 50° C. for 2 minutes, and then immersed in pure water for 1 minute. Next, the substrate was immersed in a mixed solution of a reagent 1 for an accelerator (manufactured by JCU CORPORATION, trade name: ES-400A) and a reagent 2 for an accelerator (manufactured by JCU CORPORATION, trade name: ES-400B) (ES-400A concentration: 10 mL/L, ES-400B concentration: 14 g/L) as an accelerator at 35° C. for 2 minutes, and then immersed in pure water for 1 minute.

Next, the substrate was immersed in a mixed solution of electroless nickel plating solutions (manufactured by JCU CORPORATION, trade name: ES-500M, ES-500B, ES-500C, and ES-500D), ammonia water, and sulfuric acid (ES-500M concentration: 45 mL/L, ES-500B concentration: 30 mL/L, ES-500C concentration: 45 mL/L, ES-500D concentration: 40 mL/L, ammonia water concentration: 24 mL/L, sulfuric acid concentration: 1 mL/L) at 38° C. for 7 minutes, and then immersed in pure water for 1 minute. Thereafter, drying was performed by a hot plate set at 85° C. for 5 minutes. Next, the thermal annealing was performed in an oven set at 180° C. for 1 hour. The subsequent steps were performed in the same manner as in Example 1 to manufacture a wiring board.

Comparative Example 3

In the step (2), the seed layer was formed on the surface of the first insulating material layer using an electroless copper plating solution in a state where the nickel concentrate is more increased than that in Example 3. That is, first, as alkali cleaning, the substrate was immersed in 110 mL/L of an aqueous solution of an alkali cleaner (manufactured by JCU CORPORATION, trade name: EC-B) at 50° C. for 5 minutes, and then immersed in pure water for 1 minute. Next, the substrate was immersed in a mixed solution of a conditioning liquid (manufactured by JCU CORPORATION, trade name: PB-200) and EC-B (PB-200 concentration: 70 mL/L, EC-B concentration: 2 mL/L) as a conditioner at 50° C. for 5 minutes, and then immersed in pure water for 1 minute. Next, as soft etching, the substrate was immersed in a mixed solution of a soft etching liquid (manufactured by JCU CORPORATION, trade name: PB-228) and 98% sulfuric acid (PB-228 concentration: 100 g/L, sulfuric acid concentration: 50 mL/L) at 30° C. for 2 minutes, and then immersed in pure water for 1 minute. Next, as desmutting, the substrate was immersed in 10% sulfuric acid at room temperature for 1 minute. Next, the substrate was immersed in a mixed solution of a reagent 1 for catalyzing (manufactured by JCU CORPORATION, trade name: PC-BA), a reagent 2 for catalyzing (manufactured by JCU CORPORATION, trade name: PB-333), and EC-B (PC-BA concentration: 5 g/L, PB-333 concentration: 40 mL/L, EC-B concentration: 9 mL/L) as a catalyzer at 60° C. for 5 minutes, and then immersed in pure water for 1 minute. Next, the substrate was immersed in a mixed solution of a reagent for an accelerator (manufactured by JCU CORPORATION, trade name: PC-66H) and PC-BA (PC-66H concentration: 10 mL/L, PC-BA concentration: 5 g/L) as an accelerator at 30° C. for 5 minutes, and then immersed in pure water for 1 minute.

Next, as electroless copper plating, the substrate was immersed in a mixed solution of electroless copper plating solutions (manufactured by JCU CORPORATION, trade name: AISL-570B, AISL-570C, and AISL-570MU), PC-BA, and nickel sulfate hexahydrate (AISL-570B concentration: 70 mL/L, AISL-570C concentration: 24 mL/L, AISL-570MU concentration: 50 mL/L, PC-BA concentration: 13 g/L, nickel sulfate hexahydrate concentration: 20 g/L) at 60° C. for 7 minutes, and then immersed in pure water for 1 minute. Thereafter, drying was performed by a hot plate set at 85° C. for 5 minutes. Next, the thermal annealing was performed in an oven set at 180° C. for 1 hour. The subsequent steps were performed in the same manner as in Example 1 to manufacture a wiring board.

Comparative Examples 4 and 5

Wiring boards were obtained in the same manner as in Examples 4 and 5, except that, in the step (1c), the surface of the first insulating material layer was modified (roughened) using a chemical liquid used in the desmear treatment instead of irradiation of ultraviolet rays.

Comparative Example 6

A wiring board was manufactured in the same manner as in Example 5, except that, in the step (2), the seed layer was formed on the surface of the first insulating material layer using an electroless nickel plating solution instead of the electroless copper plating solution used in Example 5.

Comparative Example 7

A wiring board was manufactured in the same manner as in Comparative Example 3, except that a thermosetting resin film was used in formation of the first insulating material layer instead of a photosensitive resin film.

<Measurement of Arithmetic Average Roughness Ra of Surface of Insulating Material Layer>

The arithmetic average roughness Ra of the surface of the first insulating material layer according to Examples 1 to 10 and Comparative Examples 1 to 7 was measured using a laser microscope (manufactured by Olympus Corporation). The results are shown in Table 1.

<Ni Content Rate of Seed Layer>

The Ni content rate (% by mass) of the seed layers according to Examples 1 to 10 and Comparative Examples 1 to 7 was obtained by performing EDX analysis using an electron scanning microscope (manufactured by Hitachi High-Tech Corporation) and was converted into a mass ratio. The results are shown in Table 1.

TABLE 1

| | First insulating material layer | | | | Ni content rate (% by mass) of seed layer |
|---|---|---|---|---|---|
| | Property of resin composition | Surface treatment | Ra (nm) | Electroless plating | |
| Example 1 | Photosensitive | Ultraviolet ray irradiation | 43 | Electroless Cu—Ni—P plating | 6 |
| Example 2 | Photosensitive | Ultraviolet ray irradiation | 45 | Electroless Cu—Ni—P plating | 12 |
| Example 3 | Photosensitive | Ultraviolet ray irradiation | 42 | Electroless Cu—Ni—P plating | 18 |
| Example 4 | Photosensitive | Ultraviolet ray irradiation | 43 | Electroless Cu plating | 0.25 |
| Example 5 | Thermosetting | Ultraviolet ray irradiation | 43 | Electroless Cu plating | 0.30 |
| Example 6 | Photosensitive | Ultraviolet ray irradiation | 45 | Electroless Cu—Ni—P plating | 2.8 |
| Example 7 | Thermosetting | Ultraviolet ray irradiation | 42 | Electroless Cu—Ni—P plating | 3 |
| Example 8 | Thermosetting | Ultraviolet ray irradiation | 43 | Electroless Cu—Ni—P plating | 6 |
| Example 9 | Thermosetting | Ultraviolet ray irradiation | 45 | Electroless Cu—Ni—P plating | 12 |
| Example 10 | Thermosetting | Ultraviolet ray irradiation | 42 | Electroless Cu—Ni—P plating | 18 |
| Comparative Example 1 | Photosensitive | Roughening treatment with desmear treatment solution | 400 | Electroless Cu plating | 0.2 |
| Comparative Example 2 | Photosensitive | Ultraviolet ray irradiation | 45 | Electroless Ni plating | 94 |
| Comparative Example 3 | Photosensitive | Ultraviolet ray irradiation | 42 | Electroless Cu—Ni—P plating | 40 |
| Comparative Example 4 | Photosensitive | Roughening treatment with desmear treatment solution | 400 | Electroless Cu plating | 0.25 |
| Comparative Example 5 | Thermosetting | Roughening treatment with desmear treatment solution | 250 | Electroless Cu plating | 0.30 |
| Comparative Example 6 | Thermosetting | Ultraviolet ray irradiation | 45 | Electroless Ni plating | 92 |
| Comparative Example 7 | Thermosetting | Ultraviolet ray irradiation | 42 | Electroless Ni plating | 40 |

<Evaluation of Wiring Formability>

A wiring board having ten of each of wiring patterns with L/S of 10 µm/10 µm, 7 µm/7 µm, 5 µm/5 µm, 3 µm/3 µm, and 2 µm/2 µm was manufactured, and wiring formability was evaluated. Of ten of each of wiring patterns, a case where the fall of wiring or the peeling-off of the wiring does not occur at all was rated as "A", a case where the fall of wiring or the peeling-off of the wiring occurs in one or two wiring patterns was rated as "B", and a case where the fall of wiring or the peeling-off of the wiring occurs in three or more wiring patterns was rated as "C". The evaluation results are shown in Table 2.

TABLE 2

| Evaluation of wiring | L/S (μm/μm) | | | | |
|---|---|---|---|---|---|
| formability | 10/10 | 7/7 | 5/5 | 3/3 | 2/2 |
| Example 1 | A | A | A | A | A |
| Example 2 | A | A | A | A | A |
| Example 3 | A | A | A | A | A |
| Example 4 | A | A | A | A | A |
| Example 5 | A | A | A | A | A |
| Example 6 | A | A | A | A | A |
| Example 7 | A | A | A | A | A |
| Example 8 | A | A | A | A | A |
| Example 9 | A | A | A | A | A |
| Example 10 | A | A | A | A | A |
| Comparative Example 1 | B | B | C | C | C |
| Comparative Example 2 | A | A | A | A | A |
| Comparative Example 3 | A | A | A | A | A |
| Comparative Example 4 | B | B | C | C | C |
| Comparative Example 5 | B | B | B | C | C |
| Comparative Example 6 | A | A | A | A | A |
| Comparative Example 7 | A | A | A | A | A |

As shown in Table 2, it is found that, in Examples 1 to 10, even when the wiring pattern (L/S) becomes finer, the fall of wiring or the peeling-off of the wiring is not observed at all, and a micro wiring has excellent wiring formability. Furthermore, also in Comparative Examples 2, 3, 6, and 7, similarly, wiring moldability was excellent. On the other hand, in Comparative Example 1, the seed layer was formed by electroless pure copper plating according to the conventional method, but even when the surface roughening of the insulating material layer was performed by the desmear treatment, the fall of wiring or the peeling-off of the wiring occurred. The fall of wiring or the peeling-off of the wiring becomes more significant as the L/S becomes finer, and Comparative Example 1 had a problem in terms of wiring formability.

<Formation of Microstrip Wiring>

Example 11

Figure 3:
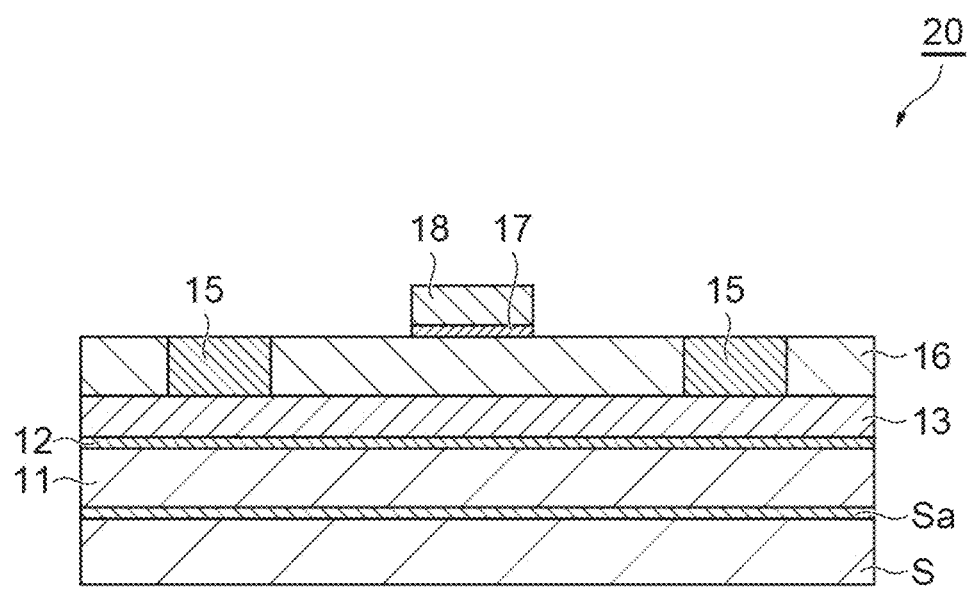
FIG. 3 is a cross-sectional view schematically illustrating a wiring board provided with a microstrip wiring produced for evaluating a transmission loss in a high frequency in Examples and Comparative Examples.

A wiring board having the same configuration as that of a wiring board 20 illustrated in FIG. 3 was manufactured for evaluating a transmission loss in a high frequency. The wiring board 20 is a wiring board having a microstrip wiring. That is, the wiring board 20 is configured by a support substrate S having a conductive layer Sa (copper layer) on the surface, an insulating material layer 11 provided on the surface of the support substrate S, a seed layer 12 provided on the surface of the insulating material layer 11, a ground layer 13 (conductor part) provided on the surface of the seed layer 12, a conductor part 15 and an insulating material layer 16 provided on the surface of the ground layer 13, and a seed layer 17 and a signal layer 18 (conductor part) provided on the surface of the insulating material layer 16. The seed layer 12 is used as a power supply layer when the ground layer 13 is formed. The seed layer 17 is used as a power supply layer when the signal layer 18 is formed. Upon manufacturing the wiring board, the insulating material layer 11 was formed using the same photosensitive resin film as that of Example 1. The signal layer 18 was formed to have a thickness of 4 μm, a width of 20 μm, and a length of 10 mm. A wiring board according to Example 11 was manufactured through the steps of forming the seed layers 12 and 17, respectively, by the same method as in Example 1.

Examples 12 to 20

Wiring boards according to Examples 12 to 20 were manufactured, respectively, in the same manner as in Example 11, except that the seed layers 12 and 17 were formed respectively by the same methods as in Examples 2 to 10.

Comparative Examples 8 to 14

Wiring boards according to Comparative Examples 8 to 14 were manufactured, respectively, in the same manner as in Example 11, except that the seed layers 12 and 17 were formed respectively by the same methods as in Comparative Examples 1 to 7.

<Measurement of Transmission Loss>

Regarding the microstrip wirings according to Examples 11 to 20 and Comparative Examples 8 to 14, the transmission loss was measured using a vector network analyzer (manufactured by HP company). The characteristic impedance was set to 50Ω. A case where the transmission loss when the frequencies are 10 GHz, 20 GHz, 30 GHz, 40 GHz, and 50 GHz is 0 to 1 dB/cm or less was rated as "A", a case where the transmission loss is 1 to 2 dB/cm was rated as "B", and a case where the transmission loss is 2 dB/cm or more was rated as "C". The evaluation results are shown in Table 3.

TABLE 3

| Evaluation of | Method of forming | Frequency (GHz) | | | | |
|---|---|---|---|---|---|---|
| transmission loss | seed layer | 10 | 20 | 30 | 40 | 50 |
| Example 11 | Example 1 | A | A | A | A | A |
| Example 12 | Example 2 | A | A | A | A | A |
| Example 13 | Example 3 | A | A | A | A | A |
| Example 14 | Example 4 | A | A | A | A | A |
| Example 15 | Example 5 | A | A | A | A | A |
| Example 16 | Example 6 | A | A | A | A | A |
| Example 17 | Example 7 | A | A | A | A | A |
| Example 18 | Example 8 | A | A | A | A | A |
| Example 19 | Example 9 | A | A | A | A | A |
| Example 20 | Example 10 | A | A | A | A | A |
| Comparative Example 8 | Comparative Example 1 | C | C | C | C | C |
| Comparative Example 9 | Comparative Example 2 | B | C | C | C | C |
| Comparative Example 10 | Comparative Example 3 | A | B | C | C | C |
| Comparative Example 11 | Comparative Example 4 | C | C | C | C | C |
| Comparative Example 12 | Comparative Example 5 | C | C | C | C | C |
| Comparative Example 13 | Comparative Example 6 | B | C | C | C | C |
| Comparative Example 14 | Comparative Example 7 | A | B | C | C | C |

As shown in Table 3, it was confirmed that Examples 11 to 20 have a low transmission loss and excellent transmission properties. On the other hand, Comparative Examples 8, 11, and 12 had a problem in terms of wiring formability as shown in Table 2, and thus the transmission loss became larger. Furthermore, in Comparative Examples 9, 10, 13, and 14, the content rate of nickel contained in the seed layer was high, and due to this effect, the transmission loss in a high frequency became larger. It is found from Table 3 that an increase in transmission loss becomes significant as the content rate of nickel contained in the seed layer is increased.

INDUSTRIAL APPLICABILITY

According to the present disclosure, there are provided a wiring board, which has excellent adhesiveness between an insulating material layer and a metal wiring and a small transmission loss in a high frequency, and a method for manufacturing the same.

REFERENCE SIGNS LIST

1: first insulating material layer, 2: seed layer (metal layer), 3: wiring part (conductive part), 4: metal wiring, 5: second insulating material layer, 10, 20: wiring board, 11, 16: insulating material layer, 12, 17: seed layer, 13: ground layer, 15: conductor part, 18: signal layer, S: support substrate, Sa: conductive layer.

The invention claimed is:

1. A semiconductor package comprising:
a wiring board; and
a semiconductor element mounted on the wiring board;
wherein the wiring board comprises:
a first insulating material layer having a surface with an arithmetic average roughness Ra of 100 nm or less;
a metal wiring provided on the surface of the first insulating material layer; and
a second insulating material layer provided to cover the metal wiring, wherein
the metal wiring is configured by a metal layer in contact with the surface of the first insulating material layer and a conductive part stacked on a surface of the metal layer, and
a nickel content rate of the metal layer is 0.25 to 20% by mass.

2. The semiconductor package according to claim 1, wherein the nickel content rate of the metal layer is 3 to 20% by mass.

3. The semiconductor package according to claim 1, wherein the nickel content rate of the metal layer is 0.25 to 3% by mass.

4. The semiconductor package according to claim 1, wherein the first insulating material layer is composed of a cured product of a thermosetting resin composition.

5. The semiconductor package according to claim 1, wherein the first insulating material layer is composed of a cured product of a photosensitive resin composition.

6. The semiconductor package according to claim 1, further comprising a support substrate the first insulating layer being formed on,
wherein the support substrate is wafer-shaped and has a diameter of 200 mm, 300 mm or 450 mm.

7. The semiconductor package according to claim 1, further comprising a support substrate the first insulating layer being formed on,
wherein the support substrate is rectangular panel-shaped and has a side of 300 to 700 mm.

8. The semiconductor package according to claim 1, wherein the first insulating layer has a thermal expansion coefficient of $80 \times 10^{-6}$/K or less.

* * * * *